United States Patent [19]
Meador et al.

[11] Patent Number: 5,919,599
[45] Date of Patent: Jul. 6, 1999

[54] THERMOSETTING ANTI-REFLECTIVE COATINGS AT DEEP ULTRAVIOLET

[75] Inventors: Jim Meador, Ballwin; Douglas J. Guerrero, Rolla; Xie Shao, Rolla; Vandana Krishnamurthy, Rolla, all of Mo.

[73] Assignee: Brewer Science, Inc., Rolla, Mo.

[21] Appl. No.: 08/940,169

[22] Filed: Sep. 30, 1997

[51] Int. Cl.$^6$ .......................... G03C 1/492; C08K 63/00; C08F 283/10

[52] U.S. Cl. ..................... 430/271.1; 430/270.1; 430/512; 523/436; 525/523; 525/533

[58] Field of Search .............................. 430/271.1, 270.1, 430/512, 517; 523/436; 525/523, 533

[56] References Cited

U.S. PATENT DOCUMENTS

| | | | |
|---|---|---|---|
| 4,316,940 | 2/1982 | Thornley | 428/413 |
| 4,544,691 | 10/1985 | Dexter et al. | 524/99 |
| 4,657,842 | 4/1987 | Finter et al. | 430/280 |
| 5,294,680 | 3/1994 | Knors et al. | 525/327.4 |
| 5,482,817 | 1/1996 | Dichiara et al. | 430/271.1 |
| 5,654,376 | 8/1997 | Knors et al. | 525/327.4 |
| 5,693,691 | 12/1997 | Flaim et al. | 523/436 |
| 5,731,385 | 3/1998 | Knors et al. | 525/327.6 |

*Primary Examiner*—John A. McPherson
*Assistant Examiner*—Rosemary Ashton
*Attorney, Agent, or Firm*—Veo Peoples, Jr.; Holly Amjad

[57] ABSTRACT

Anti-reflective coating compositions having improved etch rate, inter alia, are prepared from certain high molecular weight polymers and copolymers, particularly glycidyl methacrylate with grafted dyes.

19 Claims, 2 Drawing Sheets

THERMOSETTING ANTI-REFLECTIVE COATINGS AT DEEP ULTRAVIOLET

BACKGROUND OF INVENTION

1. Field of Invention

The present invention relates to bottom layer, thermosetting anti-reflective coating compositions for use in deep ultraviolet multilayer photoresist systems, particularly to those having improved etch rates, conformality, and optical density at 248 nm wavelength exposure.

2. Background of the Prior Art

Bottom layer anti-reflective coating compositions for use in multilayer photoresist systems have traditionally contained high molecular weight thermoplastic binders such as polysulfones, polyurea sulfones, and poly(vinylpyridine) with high insolubility in photoresist solvents, which has also been referred to as "high differential solubility". These binders serve to inhibit intermixing of the anti-reflective composition with the top layer photoresist. Such thermoplastic binders often require strongly polar solvents such as N-methylpyrrolidone, γ-butyrolactone, and tetrahydrofurfuryl alcohol, which are hygroscopic, have high surface tensions, and exhibit low volatility. While such solvents may be beneficial to "differential solubility", they also lead to a variety of film defects such as dimpling, dewetting, voiding, bubbling, and thickness variations, because of their low volatility.

There is a present trend to reduce the feature size of semiconductor circuitry. As the feature size approaches sub-0.30 micron dimensions, the aforementioned disadvantages of thermoplastic anti-reflective coatings, as well as the drawbacks described in U.S. Pat. Nos. 5,234,990, 5,401,614, 5,482,817, 5,554,485 and European patent application no. 95480087.6, incorporated herein by reference, become increasingly problematic. The most notable problem is that their so-called resistance to intermixing with photoresists becomes less and less complete. Accordingly, slight intermixing always occurs, producing small but discernable distortions at the bottom of resist features. Because the feature sizes are so small, even these small distortions become unacceptable for producing good quality, practical devices.

In order to overcome these drawbacks, there has arisen a need to develop binders, for anti-reflective coatings, from thermosetting, rather than thermoplastic, polymers. Such polymers would cure quickly enough to be coatable from fast-drying solvents, and thus solvent resistance and coating quality could be improved. U.S. Pat. No. 5,693,691, entitled Thermosetting Anti-Reflective Coatings Compositions, and our co-pending application Ser. No. 08/692,714, entitled Method for Making Multilayer Resist Structures with Thermosetting Anti-Reflective Coatings, herein incorporated by reference, describe the development of thermosetting anti-reflective coatings and disclose novel improvements in composition and methods. The anti-reflective coatings described therein are comprised principally of an oligomeric, hydroxyl-functional resin, an aminoplast crosslinking agent, a protonic acid catalyst, and an appropriate solvent vehicle, wherein the hydroxyl-functional resin is the reaction product of a phenolic or carboxylic acid dye with a low molecular weight epoxy resin having an epoxy functionality of 3 to 10. The coatings are cured by baking for 30 to 120 seconds at temperatures above 150° C. As taught in U.S. Pat. No. 5,693,691 and our co-pending application, Ser. No. 08/692,714 these compositions, which are soluble in volatile organic solvents, are improvements over the prior art since they offer (1) high optical density in ultra thin films (<2000 Å); (2) virtually no intermixing with photoresists; (3) storage stability in catalyzed form; and (4) commercially feasible synthesis techniques for linking chromophores to an oligomeric resin matrix.

Although the above-described dye-attached thermosetting anti-reflective coatings derived from low molecular weight epoxy resins provide many unexpected benefits, they too have drawbacks. One such drawback occurs upon plasma etching images into the anti-reflective coating layer. For example, in U.S. Pat. No. 5,693,691 (see present, Comparative Example 1), oxygen plasma etching proceeds at rates no faster than about 1.25 times that of prior art thermoplastic resins, such as the polyarylethersulfone anti-reflective coating described in U.S. Pat. No. 5,234,990. Since polyarylethersulfone anti-reflective coatings are known to etch 1.25 times more slowly than deep ultraviolet photoresists, this implies that the thermosetting anti-reflective coating described in U.S. Pat. No. 5,693,691 will etch at approximately the same rate as the photoresist during the pattern transfer step. Since the anti-reflective coating layer thickness is typically 0.05–0.10 microns, a significant negative etch bias may be observed at resist feature sizes below 0.30 microns unless the plasma etch process is highly anisotropic.

Another limitation of dye-attached thermosetting anti-reflective coatings derived from low functionality epoxy resins is their tendency to planarize substrate topography rather than deposit conformally over surface features. The lack of conformality leads to even greater etch biasing of the photoresist since overetching must be applied to remove the anti-reflective coating from trench structures where it tends to build up during the coating and baking processes.

Dye-attached thermosetting anti-reflective coatings derived from higher molecular weight polymers than U.S. Pat. No. 5,693,691 have also been disclosed. For example, European patent application no. 92118070.9 describes deep ultraviolet anti-reflective coating compositions which contain a dye-attached acrylic copolymer and an aminoplast crosslinking agent. The copolymer is preferably formed by copolymerizing a 9-anthracene ester monomer such as 9-anthranol methacrylate and a hydroxyl-functional monomer such as 2-hydroxyethyl methacrylate (HEMA) with other methacrylate esters. The anthracene unit of the first monomer is the active dye, or chromophore, which imparts deep ultraviolet absorptivity to the copolymer. (See FIG. below.) HEMA provides a site for thermal crosslinking with the aminoplast reagent when the final coating is cured.

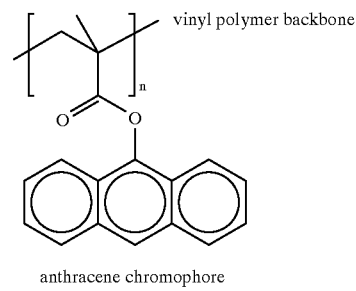

anthracene chromophore

The anthracene chromophore is attached to the vinyl backbone of the copolymer via a carboxylic ester linkage. The short, stiff linkage between the chromophore and the copolymer backbone ultimately limits the content of anthracene-bearing acrylic units in the copolymer to significantly less than 100 mole percent, since at higher contents the copolymer becomes insoluble in preferred coating solvents. This, in turn, limits maximum film optical density and, correspondingly, the anti-reflection control power of the anti-reflective coating. Also, there is an absence of an adequate concentration of hydroxyl-functional comonomer to permit effective crosslinking of the copolymer. This further limits the optical density of the anti-reflective coating.

European patent application no. 94305124.3 discloses thermosetting anti-reflective coatings which comprise at least one compound (typically a polymer or oligomer) having one or more glycidyl functions, at least one phenolic anthracene dye, and a solvent capable of dissolving these compounds. However, unlike the anti-reflective coating compositions discussed above, the anthracene dye in the title compositions is not attached to the glycidyl-bearing polymer prior to cure and an aminoplast crosslinking agent is not present in the composition. Consequently, heating for several minutes at high temperatures is required to produce sufficient reaction between the phenolic anthracene dye and the glycidyl-bearing polymer to insolubilize the coating. This long cure cycle reduces wafer throughput and makes the process generally unacceptable to manufacturers. In addition, the preparation of the title anti-reflective coatings, particularly that of the phenolic anthracene dye components, involves many steps, making the coatings too expensive to produce and use on a practical basis.

U.S. Pat. No. 5,597,868 discloses thermosetting anti-reflective coatings for 193 nm photolithography which cure analogously to the coatings described in the just described European patent application 94305124.3. A polyphenolic dye such as a novolac resin is combined with an acrylic polymer which has pendant epoxide functionality. Heating the coating results in a thermosetting reaction between the phenolic hydroxyl groups of the dye and the epoxide groups of the polymer. As claimed therein, however, the curing process must proceed for more than 10 minutes at temperatures greater than 170° C. to be effective.

SUMMARY OF THE INVENTION

It is therefore a principal object of the present invention to provide a novel thermosetting anti-reflective coating composition and method of using the same which negates the drawbacks of the prior art.

It is a particular object of this invention to improve the plasma etch rate of aminoplast-cured thermosetting anti-reflective coatings relative to photoresist layers while retaining fast curing speed; high optical density; good solubility in, and coatability from, safe, volatile solvents; high post-cure differential solubility; and reasonable cost.

It is also a particular object of the present invention to improve conformality and feature coverage in comparison to other dye-attached thermosetting anti-reflective coatings.

It is an additional object to provide higher film optical density at 248 nm exposing wavelength than prior art dye-attached anti-reflective coatings which are cured with aminoplast crosslinking agents. Higher optical density permits the use of thinner anti-reflective coating layers, which in turn permits shorter etch times and reduces etch bias.

The improved thermosetting anti-reflective coating composition is comprised principally of 1) the reaction product of an acrylic polymer or copolymer with a deep ultraviolet light-absorbing, carboxylic acid dye or phenolic dye whereupon the linkage uniting the polymer and dye is a hydroxyl functional moiety; 2) a multi-functional aminoplast (or reactively equivalent) crosslinking agent; and 3) a protonic acid catalyst, all of which are dissolved in a suitable highly volatile solvent vehicle. The composition is applied onto a semiconductor substrate and then heated typically for 60 seconds to form a crosslinked coating which exhibits high optical density at 248 nm exposing wavelength, fast plasma etching characteristics, high conformality, and excellent compatibility with chemically-amplified deep ultraviolet photoresists.

DETAILED DESCRIPTION AND PREFERRED EMBODIMENTS

Figure 1:
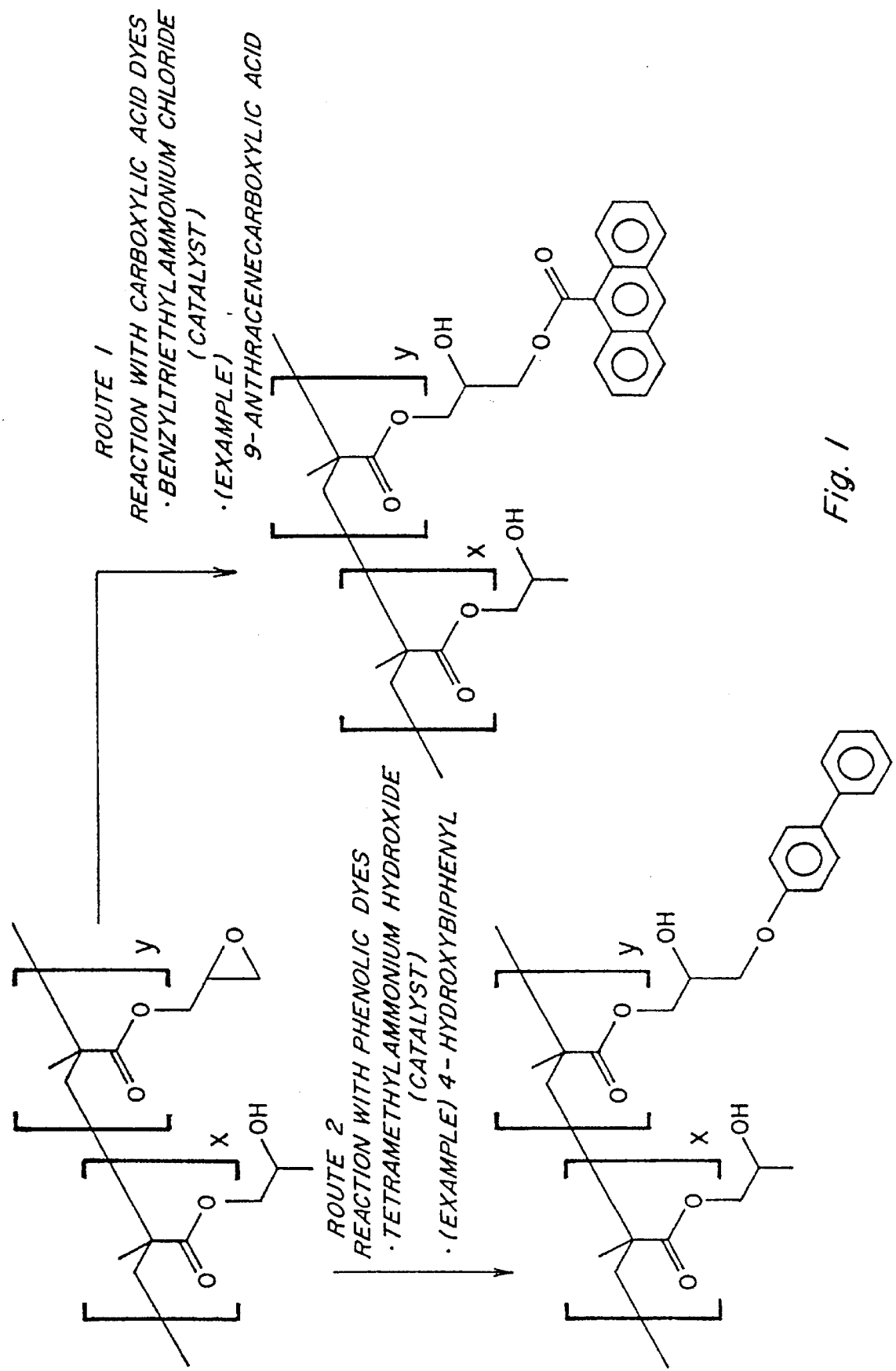
FIG. 1 is a schematic diagram showing the processes for reacting a glycidyl methacrylate-containing acrylic copolymer with a representative carboxylic acid dye and a representative phenolic dye.

The thermosetting anti-reflective coating compositions of the present invention generally comprise:

a. the reaction product of a high molecular weight acrylic polymer or copolymer, preferably glycidyl methacrylate, with deep ultraviolet (D.U.V.) light-absorbing carboxylic acid or phenolic dyes, wherein the dye is attached to the polymer via in situ reaction of the carboxylic acid or phenolic group with the glycidyl group of the polymer to form a hydroxyester or hydroxyether function, respectively;

b. an alkylated aminoplast crosslinking agent such as melamine, urea, benzoguanamine, or glycoluril or derivatives thereof;

c. a protonic acid catalyst (for curing);

d. a low-to-medium boiling (70° C.–180° C.) alcohol-containing solvent system comprising at least 20% by weight alcohol.

The new compositions provide faster etching characteristics, higher conformality, and greater maximum optical density than thermosetting anti-reflective coatings derived from low molecular weight epoxy resins. In addition, they provide improved solubility at high dye content over dye-attached acrylic copolymer compositions such as those disclosed in European patent application 92118070.9. This feature derives from the nature of the linkage used to join the dye to the vinyl backbone of the polymer, i.e., the hydroxy ester or hydroxy ether functional moieties. The structure of the linkage in the new acrylic compositions is depicted below using an anthracene chromophore as an example.

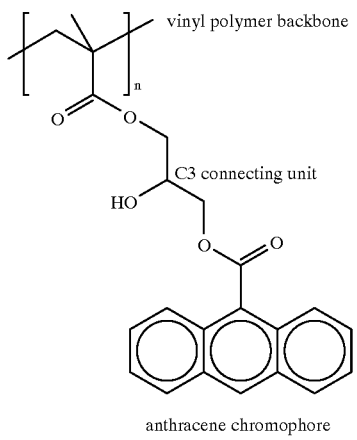

anthracene chromophore

In the present invention, the linkage is preferably comprised of two carboxylic acid esters intervened by a $C_3$ unit. The $C_3$ unit is additionally substituted by a hydroxyl group at the 2 position. We have discovered that the $C_3$ linkage reduces the overall rigidity of the polymer in comparison to the prior art acrylic copolymers, allowing it to remain soluble in preferred coating solvents even when the polymer is fully comprised of anthracene-bearing acrylic units. The hydroxyl group on the $C_3$ linkage unit provides additional driving force for solubilization and serves as a reaction site for the aminoplast crosslinking agent, meaning higher crosslink densities and, therefore, greater differential solubility can be achieved than with prior art acrylic systems where crosslinking cannot occur at the chromophore-bearing acrylic units.

Components of Composition

1. Acrylic Polymer/Copolymer

The glycidyl methacrylate polymer or copolymer to which the dyes are attached can be prepared by well known free radical solution polymerization methods. The preferred number-average molecular weight (Mn) range for the copolymer is 5,000–30,000 g/mol; the preferred weight-average molecular weight (Mw) range is 20,000–100,000 g/mol. An especially preferred range for Mn is 10,000–20,000 g/mol; an especially preferred range for Mw is 30,000–70,000 g/mol.

The acrylic polymer may be a homopolymer of glycidyl methacrylate (GMA) or a copolymer of GMA with (meth) acrylate comonomers such as 2-hydroxyethyl methacrylate (HEMA), hydroxypropyl methacrylate (HPM), methyl methacrylate, or 2-chloroethyl methacrylate. Hydroxyl-functional comonomers such as HEMA and HPM are especially preferred because they provide additional reaction sites for the aminoplast crosslinking agents which are present in the final coating. If comonomers are used, glycidyl methacrylate should comprise at least 20 mole percent of the monomer units and, more preferably, 30 mole percent, which enhances the optical density achieved via dye attachment to the glycidyl-bearing units. Likewise, a hydroxyl equivalent weight for the polymer less than 400 g/eq is preferred in order to obtain the most improved and effective crosslink density in the final cured coating.

2. Deep Ultraviolet Light-absorbing Dyes

Suitable monofunctional carboxylic acid and phenolic dyes are attached to the acrylic polymer to impart deep ultraviolet light absorbency to the anti-reflective coating. The intrinsic absorptivity of the dye as well as the concentration of polymer-bound dye should be sufficient to provide an optical density of at least 7.0 per micron film thickness at an exposing wavelength of 248 nm. An optical density of >9.0 per micron film thickness at 248 nm is especially desirable for performing sub-0.30 micron photolithography.

Preferred carboxylic acid dyes include 9-anthracenecarboxylic acid (ACA), 2-naphthoic acid, 9-acridinecarboxylic acid, and p-anisic acid. Suitable phenolic dyes include 4-hydroxybiphenyl, 2-hydroxyquinaldine, 5,7-dichloro-8-hydroxyquinoline, and 2-acetoxynaphthol. Of all of these structures, ACA is an especially preferred dye because of its high intrinsic absorptivity at 248 nm exposing wavelength.

It is to be understood that the dyes described above may be chemically modified at various points within their structure, e.g., by nitro substitution on an aromatic ring, while retaining or even improving their useful light-absorbing properties.

3. Acid Catalysts

While p-toluenesulfonic acid is a preferred acid catalyst, other strong protonic acids such as dodecylbenzenesulfonic acid, oxalic acid, phthalic acid, phosphoric acid, and mixtures thereof, may be employed suitably. Acid catalysts with formula weights greater than 80 g/mole are preferred to prevent sublimination when the anti-reflective coating is thermally cured.

4. Crosslinking Agents

The new anti-reflective coatings are cured on the semiconductor substrate by the application of heat. Heating induces a crosslinking reaction between the hydroxyl substituents on the dye-attached acrylic polymer and the aminoplast crosslinking agent. Such curing mechanisms are well known to include polyester polyols such as those used in industrial coatings and finishes. Suitable aminoplasts include glycoluril-formaldehyde resins, melamine-formaldehyde resins, benzoguanamine-formaldehyde resins, and urea-formaldehyde resins. The use of methylated and/or butylated forms of these resins is highly preferred for obtaining long storage life of from about three to twelve months, under catalyzed conditions. Methylated glycoluril-formaldehyde resins such as Cytec Industries POWDER-LINK® 1174 are especially preferred because of their reduced basicity and, therefore, lower tendency to interact chemically with acid-catalyzed photoresists. The aminoplast resin is preferably added to the coating in a proportion which provides 0.20–2.00 equivalents of reactive alkoxymethyl crosslinking function per polymer hydroxyl function. A proportion which provides 0.50–1.00 reactive equivalents per hydroxyl is especially preferred.

Other curing modes can be applied to the new anti-reflective coatings, though the use of aminoplast crosslinking agents is highly preferred. These alternative modes may operate singly or in concert with the aminoplast curing process. For example, if unreacted glycidyl functionality is present on the dye-attached acrylic polymer, polyphenols such as novolacs and poly(4-hydroxystyrene) can effect thermal crosslinking of the anti-reflective coating by reaction at the free glycidyl sites to form aryl ether linkages. Such a process differs from those disclosed in prior art processes such as U.S. Pat. No. 5,597,868 and European patent application 94305124.3 in that the polyphenols used in the present invention would not serve as the primary dyes within the anti-reflective coating. They instead would serve only as curing agents for the coating.

5. Solvents and Additives

Suitable solvents for the new anti-reflective coatings include alcohols, esters, glymes, ethers, cyclic ketones, and their admixtures which boil in the range 70° C.–180° C.

Especially preferred solvents and co-solvents include 1-methoxy-2-propanol (PGME), cyclohexanone, ethyl 3-ethoxypropionate, and ethyl lactate. Alcohols such as PGME and ethyl lactate should comprise at least 20 weight percent of the coating solvent system to lend long storage life.

The coatings may be amended with small amounts (up to 20 weight percent of total solvents) of conventional high boiling anti-reflective coating solvents such as γ-butyrolactone and tetrahydrofurfuryl alcohol to improve the solubility of the dye-attached polymer component, provided the solvents do not cause coating quality or photoresist incompatibility problems. Surfactants such as 3M Company's FLUORAD® FC-171 or FC-430 and adhesion promoters such as glycidoxypropyl triethoxysilane may be added to optimize coating performance.

Method of Preparation

A reaction scheme for preparing the dye-attached acrylic polymer of the present invention is shown in FIG. 1. In the first step, a glycidyl methacrylate-containing polymer or copolymer is reacted in solution with, for example, a carboxylic acid dye (Route 1). The reaction opens the epoxy ring of the glycidyl function to form a hydroxyester linkage. The reaction is carried out at about 80° C.–200° C. under nitrogen cover in the presence of a catalyst. While a variety of catalysts may be used, tetraalkylammonium chlorides are preferred. For reasons of economy, the reaction product is preferably left in solution and used as a mother liquor. Similar reaction conditions are employed when a phenolic dye is attached (Route 2). In such instances, however, tetramethylammonium hydroxide or other strong bases are preferred catalysts. Normally, the molar ratio of dye to glycidyl function is adjusted to about 1.0 unless excess glycidyl function is required for crosslinking.

In a second step, the solution of dye-attached polymer is combined with the crosslinking agent(s), catalyst(s) and other additives to obtain the desired final formulation. Solids level in the anti-reflective coating solution is adjusted typically to about 2.5–10.0 weight percent to achieve the desired 500–2500 Å film thickness.

Preferred Coating Compositions Preferred proportions for the dye-attached acrylic polymer, aminoplast crosslinking agent, and acid catalyst in the new anti-reflective coatings are shown in the table below:

| PROPORTIONALITY FACTOR | VALUE |
| --- | --- |
| 1) REACTIVE EQUIVALENTS OF AMINOPLAST TO ACRYLIC POLYMER HYDROXYL | 0.20–2.00 |
| 2) WEIGHT PERCENT ACID CATALYST BASED ON WEIGHT OF AMINOPLAST | 5–20 |
| 3) WEIGHT PERCENT TOTAL SOLIDS IN COATING | 2.5–10.0 |

When combined in these proportions, the anti-reflective coatings demonstrate excellent resist compatibility, good ambient storage stability, and rapid curing characteristics at bake temperatures between 150° C.–225° C.

Method of Use

The thermosetting polyacrylate anti-reflective coating compositions can be used effectively on all semiconductor substrates including crystalline and polycrystalline silicon, silicon dioxide, silicon (oxy)nitride, aluminum, aluminum/silicon alloys, and tungsten. The anti-reflective coatings are applied by spin coating at 1000–6000 rpm for 30–90 seconds. Spinning speeds of 1500–4000 rpm are especially preferred for obtaining uniform, defect-free coatings on the 6" and 8" substrates commonly used in semiconductor manufacture. The spin coated film is then cured at 120° C.–225° C. for 30–120 seconds on a hot plate or equivalent baking unit. Bake temperatures of 150° C.–225° C. and bake times of 45–90 seconds are especially effective for achieving high differential solubility to the photoresist.

A photoresist is applied over the cured anti-reflective coating by spin coating and then soft baked, exposed, and developed to create the desired masking pattern. An optional post-exposure bake may be applied to the resist prior to development. The resist pattern is then transferred into the anti-reflective coating layer by reactive ion etching (also known as dry etching or plasma etching) using various gases or gas mixtures which are known in the microlithographic art to be effective for etching organic materials, e.g., $O_2$, $Cl_2$, $CF_4$, $HCF_3$, $SF_6$, their admixtures with $N_2$, Ar, and He, etc. After the anti-reflective coating layer has been etched, the semiconductor substrate can be selectively etched, implanted, or deposited on through the pattern formed in the resist and anti-reflective coating. When these steps have been completed, the resist and anti-reflective coating are removed by plasma etching and/or dissolution in liquid stripping chemicals. The stripped substrate is then ready for a new processing cycle.

The following non-limiting examples are illustrative of the invention.

EXAMPLE 1

An anti-reflective coating was prepared by combining 90 mole percent dye-attached poly(glycidyl methacrylate) with a melamine-formaldehyde resin and acid catalyst.

A. Preparation of Poly(Glycidyl Methacrylate) Homopolymer [PGM].

Glycidyl methacrylate (15.0 g, 106 mmol), 60 g of cyclohexanone, and 0.15 g of 2,2'-azobis(2-methylproprionitrile) [AIBN] were charged into a 250 ml three-necked flask equipped with magnetic stirring bar, thermometer, nitrogen inlet, and condenser with nitrogen outlet. The reaction mixture was purged with nitrogen for 10 minutes and the flask then immersed in an oil bath at 74° C. The contents were stirred under a nitrogen blanket for 18 hours at 68° C.–77° C. to complete the polymerization.

On adding a few drops of the resulting 20% polymer solids solution to stirred methanol the expected white precipitate of PGM formed.

B. Addition of 9-Anthracenecarboxylic Acid [ACA] to PGM.

An aliquot (12.5 g) of the above PGM solution containing 2.51 g polymer solids and a calculated 17.6 meq of free epoxy function was combined with 3.51 g (15.8 mmol) of ACA, 31.2 g of cyclohexanone, and 0.18 g (0.70 mmol) of benzyltriethylammonium chloride. The reaction was stirred at 92° C.–101° C. under nitrogen for 20 hours and then allowed to cool to RT.

C. Optical Density of Dye-attached Polymer

A 4.50 g sample of the mother liquor was diluted with 5.51 g of 1-methoxy-2-propanol (PGME), filtered (0.2 μm), spin coated onto a quartz wafer at 4000 rpm for 60 seconds, and hot plate baked at 175° C. for 60 seconds to obtain a cured film with an optical density of 14.8/μm at 248 nm wavelength.

D. Anti-Reflective Coating Formulation.

A 14.4 g sample of the mother liquor, 1.06 g of CYMEL® 303LF melamine-formaldehyde resin, 55 mg of p-TSA.$H_2O$, and 34.5 g of PGME were stirred at ambient to give the anti-reflective coating. (CYMEL® 303LF is a highly methylated melamine-formaldehyde produced by Cytec Industries.)

E. Anti-Reflective Coating Properties.

The solution was filtered (0.2 μm), spin coated onto a quartz wafer, and then baked at 175° C. for 60 seconds to give an anti-reflective coating with an optical density of 11.5/μm at 248 nm wavelength and film thickness of 1456 Å. A stripping test (see below) was performed with ethyl lactate to determine the solvent resistance of the anti-reflective coating. There was a negligible 0.3% thickness loss, indicating excellent solvent resistance.

Description of Stripping Test

The film thickness and optical absorbance of the cured anti-reflective coating layer are determined on silicon and quartz substrates, respectively. The specimens are then flooded with ethyl lactate, a common photoresist solvent, for 5 seconds followed by spin drying at 5000 rpm for 30 seconds. The film thickness and optical absorbance are re-determined. If more than a few percent decrease (>5%) in film thickness or optical absorbance results from solvent stripping, the anti-reflective coating is judged to have insufficient solvent resistance for practical usage.

EXAMPLE 2

An anti-reflective coating was prepared by combining fully dye-attached poly(glycidyl methacrylate) with a glycoluril-formaldehyde crosslinking agent and acid catalyst.

A. Addition of 9-Anthracenecarboxylic Acid to PGM

An aliquot (26.0 g) of PGM solution containing 5.22 g polymer solids having a calculated 36.7 meq of free glycidyl function was combined with 8.17 g (36.7 mmol) of ACA, 70.0 g of cyclohexanone, and 0.45 g (1.98 mmol) of benzyltriethylammonium chloride. The solution was stirred under a nitrogen blanket at 96° C.–104° C. for 6.75 hours. After cooling to RT, 380 mg (2.00 mmol) of p-toluenesulfonic acid [p-TSA.H$_2$O] was added. The reaction solution then cleared.

B. Anti-Reflective Coating Formulation

A 15.00 g sample of the above mother liquor containing a calculated 5.40 meq of polymer hydroxyl function was mixed with 36.4 g of PGME, 0.58 g (5.40 meq) of Cytec Industries POWDERLINK® 1174 methylated glycoluril-formaldehyde resin, and 41.2 mg of p-TSA.H$_2$O to give an anti-reflective coating. Deionization was accomplished by stirring the solution with 2.6 g of solvent-washed AMBERLITE®200 ion exchange beads for 4 hours. (AMBERLITE 200 is a strongly acidic high-capacity ion exchange resin from Rohm and Haas.)

C. Anti-Reflective Coating Properties

The anti-reflective coating was filtered (0.2 μm) and spin coated onto quartz and silicon wafers and then baked on a hot plate at 205° C. for 60 seconds to obtain a cured film with an optical density of 14.7/μm at 248 nm wavelength. A stripping test was performed with ethyl lactate to determine the solvent resistance of the anti-reflective coating. Negligible changes in film thickness and optical density were observed. An interlayer test (see below) with Shipley APEX-E® photoresist was also performed, with a small increase in anti-reflective coating thickness observed (46 Å or 4.2% of starting thickness).

The results demonstrated that a fully soluble acrylic polymer wherein each monomer unit is dye-attached with an anthracene chromophore could be prepared and used as a thermo-setting anti-reflective coating component. The results likewise showed that effective crosslinking could be achieved without hydroxyl-functional comonomers being present in the dye-attached acrylic polymer.

D. Anti-Reflective Coating Stability.

After storage for 6 months at ambient conditions, the film thickness of the anti-reflective coating increased 9.84%, indicating that the coating solution possessed fair long-term stability.

Description of Interlayer Test

This test assesses the potential for intermixing between the photoresist and the anti-reflective coating. For deep ultraviolet anti-reflective coatings, the interlayer test is generally conducted as follows. After coating and curing, the anti-reflective coating thickness is determined by ellipsometry. Next, an 0.8-micron thick layer of deep ultraviolet photoresist such as Shipley APEX-E is spin coated over the anti-reflective coating. The photoresist is then soft baked on a hot plate at 90° C. for 60 seconds, flood exposed on a contact printer ensuring over-exposure, and post-exposure baked on a hot plate for 90 seconds at 90° C. The specimen is then dip developed in Shipley MICROPOSIT® MF-702 photoresist developer for 60 seconds to clear the exposed photoresist. After a deionized water rinse followed by drying the specimen with nitrogen, the thickness of the anti-reflective coating layer is re-determined. If significant intermixing of the anti-reflective coating and resist has occurred, the anti-reflective coating layer will show an apparent increase in thickness, which may be expressed in Å or as a percentage of the starting anti-reflective coating thickness. Anti-reflective coatings which are highly subject to intermixing will show more than a 10% increase in thickness after resist processing. An interlayer value of less than 5% is considered acceptable.

EXAMPLE 3

An anti-reflective coating like that in Example 2 was prepared but with the level of crosslinking agent reduced to a calculated 0.5 aminoplast reactive equivalents per polymer hydroxyl.

A. Anti-Reflective Coating Formulation.

A 15.0 g sample of mother liquor prepared in Example 2 containing a calculated 5.4 meq of polymer hydroxyl, 30.5 g of PGME, 0.29 g (2.7 meq) of POWDERLINK 1174, and 21.0 mg p-TSA.H$_2$O were mixed to form a coating solution.

B. Anti-Reflective Coating Properties.

The above solution was deionized for 4 hours with 5 weight percent solvent-washed AMBERLITE 200 ion exchange beads, filtered (0.2 μm), spin coated at 4000 rpm for 60 seconds, and then hot plate baked at 205° C. to produce an anti-reflective coating which exhibited an optical density of 15.5/μm at 248 nm wavelength. Ethyl lactate stripping was nil; the APEX-E interlayer was 46.7 Å (4%).

C. Anti-Reflective Coating Stability.

After storage for 5.5 months at ambient conditions, the film thickness of the anti-reflective coating had increased by 14.8%.

EXAMPLE 4

An anti-reflective coating was prepared by combining a dye-attached glycidyl methacrylate copolymer having excess glycidyl functionality with a polyphenol curing agent (novolac).

A. Anti-Reflective Composition Formulation Using Novolac as a Crosslinking Agent and 2-methylimidazole as catalyst.

A 10.0 g sample of the mother liquor prepared in Example 1 containing a calculated 0.37 meq of free glycidyl function, 11.5 g of cyclohexanone, 45 mg of novolac resin, and 48.8 mg of 2-methylimidazole catalyst were stirred to give a coating solution.

B. Anti-Reflective Coating Properties

The solution was filtered (0.2 μm), spin coated at 4000 rpm for 60 seconds, dried at 100° C. for 30 seconds, and hot plate baked at 205° C. for 60 seconds to give an anti-reflective coating with an optical density of 14.7/μm at 248 nm wavelength. An ethyl lactate stripping test produced <1% thickness change and 2.2% absorbance loss, demonstrating that the polyphenol curing aging effectively insolubilized the film.

C. Uncatalyzed Anti-Reflective Composition Formulation Using Novolac as a Crosslinking Agent A sample of a mother liquor similar to that prepared in Example 1 and containing a calculated 1.86 meq of free glycidyl function was combined with 235 mg of novolac resin, 1.86 meq of phenol, and sufficient cyclohexanone to give a 3.6 weight percent coating solution. The solution was deionized by stirring with 5 weight percent solvent-washed DOWEX HCR-S beads.

D. Anti-Reflective Coating Properties.

The anti-reflective coating solution was filtered (0.2 μm), spin coated at 4000 rpm for 60 seconds, dried at 100° C. for 30 seconds, and cured at 205° C. for 60 seconds to obtain a thin film with an optical density of 15.7/μm at 248 nm wavelength. The APEX-E interlayer was 77 Å (7.7%), while the ethyl lactate stripping loss was 4.5% of the starting thickness.

EXAMPLE 5

Two different carboxylic acids were attached to poly(glycidyl methacrylate) and the resulting product formulated into a thermosetting anti-reflective coating.

A. Co-addition of ACA and 4-Chlorobutyric Acid to PGM.

A 250 ml three-necked flask equipped with magnetic stirring bar, thermometer, nitrogen inlet, and condenser with nitrogen outlet was charged with 18.75 g of 20.0 weight percent PGM solution containing a calculated 26.4 meq of glycidyl function, 31.2 g of cyclohexanone, 1.47 g (6.61 mmol) of ACA, 2.43 g (19.8 mmol) of 4-chlorobutyric acid, and 0.27 g (1.18 mmol) of benzyltriethylammonium chloride. The reaction mixture was stirred under nitrogen for 20 hours at ~95° C. to obtain a 14.1 weight percent solution of dye-attached polymer.

B. Anti-Reflective Coating Formulation.

A 27.06 g aliquot of the above polymer solution containing a calculated 13.2 meq of polymer hydroxyl function was diluted with 59.6 g of PGME. POWDERLINK 1174 (355 mg, ~3.30 meq) and 35.5 mg of p-TSA.H$_2$O were then added and stirred to give a coating solution. The anti-reflective coating was deionized for 4 hours by stirring with 5 weight percent PGME-washed AMBERLITE 200 beads.

C. Anti-Reflective Coating Properties.

The coating was applied and cured at 205° C. for 60 seconds as described in previous examples. The optical density of the film at 248 nm wavelength was 8.35/μm, reflecting the low intrinsic absorptivity of 4-chlorobutyric acid. The loss of absorbance and film thickness from ethyl lactate stripping was negligible. An APEX-E interlayer test resulted in only a 30.5 Å increase in thickness, demonstrating that the relatively low aminoplast level (0.25 eq of methoxymethyl per polymer hydroxyl) effectively insolubilized the coating.

D. Plasma Etch Data.

The anti-reflective coating exhibited an etch selectivity of 1.62:1 relative to a polyarylethersulfone coating under oxygen plasma etch conditions.

E. Lithographic Performance.

The anti-reflective coating gave vertical, nondistorted feature profiles with APEX-E photoresist.

EXAMPLE 6

Glycidyl methacrylate (GMA) and hydroxypropyl methacrylate (HPM) were copolymerized with and without a chain transfer agent for molecular weight studies.

Copolymerization of GMA and HPM at a 70:30 Molar Ratio.

A 500 ml three-necked flask equipped with magnetic stirring bar, thermometer, nitrogen inlet, and condenser with nitrogen outlet was charged with 19.13 g (134.6 mmol) of glycidyl methacrylate, 45.13 g (313.0 mmol) of hydroxypropyl methacrylate (Rohm and Haas ROCRYL® 410), 256.9 g of cyclohexanone, and 0.64 g of AIBN. The contents were heated for 24 hours at 68° C.–80° C. under nitrogen to form the copolymer.

A molecular weight analysis by gel permeation chromotography (GPC) gave the following values for the copolymer: Mw—67,000; Mn—19,000; Mw/Mn—3.53.

A comparable polymerization was conducted in PGME using 0.4 weight percent dodecanethiol as a chain transfer agent to reduce polymer molecular weight. A GPC analysis gave the following property data: Mw—57,000; Mn—16,700; Mw/Mn—3.41.

EXAMPLE 7

An aminoplast-cured anti-reflective coating was prepared from a dye-attached copolymer of glycidyl methacrylate and hydroxypropyl methacrylate wherein the molar ratio of GMA to HPM was 0.25:0.75.

A. Copolymerization of Glycidyl Methacrylate and Hydroxypropyl Methacrylate.

A 500 ml three-necked flask equipped with magnetic stirring bar, nitrogen inlet, thermometer, and condenser with nitrogen outlet was charged with 7.52 g (52.9 mmol) of glycidyl methacrylate, 22.54 g (156.3 mmol) of ROCRYL 410, 120.0 g of cyclohexanone, and 150 mg of AIBN. The contents were polymerized by heating for 24 hours at 70° C.–75° C. under nitrogen to give a 20 weight percent solids solution. Adding a few drops of the copolymer solution to cyclohexanone gave a precipitate.

B. Addition of ACA to the Copolymer.

A 500 ml three-necked flask equipped with magnetic stirring bar, nitrogen inlet, thermometer, and condenser with nitrogen outlet was charged with 62.5 g of the above copolymer solution containing a calculated 22.0 meq of glycidyl function, 4.89 g (22.0 mmol) of ACA, 249 mg (1.10 mmol) of benzyltriethylammonium chloride, and 50.8 g of cyclohexanone. The acid-epoxy addition was carried out for 20 hours at 95° C.–104° C. under nitrogen.

C. Anti-Reflective Coating Formulation.

A 30.0 g aliquot of the above copolymer solution containing a calculated 22.1 meq of polymer hydroxyl function, 85.0 g of PGME, 1.19 g of POWDERLINK 1174 (~11 meq), and 119 mg of p-TSA.H$_2$O were combined by stirring. The resulting solution was deionized by stirring for 4 hours with 5 weight percent PGME-washed AMBERLITE 200 beads.

D. Anti-Reflective Coating Properties.

The coating was applied and cured as described in previous examples. The optical density of the coating at 248 nm was 8.67/μm. Ethyl lactate stripping was nil. The APEX-E interlayer was 54 Å (4.0%).

E. Plasma Etch Data.

The plasma etch selectivity of the coating in oxygen was 1.84 relative to a polyarylethersulfone coating. When etched in a gas composition comprised of argon, CF$_4$, CHF$_3$, and He, the etch selectivity to polyarylethersulfone was 1.79.

F. Lithographic Performance.

The anti-reflective coating gave excellent feature profiles with APEX-E photoresist.

G. Storage Stability.

An analogous anti-reflective coating composition wherein the acrylic copolymer was prepared in PGME rather than cyclohexanone showed excellent storage stability at ambient conditions. A film thickness increase of only 1.4% and an optical density increase of 0.24% were observed over a period of 116 days. After the same period, the APEX-E interlayer was found to be only 40 Å.

EXAMPLE 8

An anti-reflective coating was prepared analogously to that in Example 7 using an ACA-attached copolymer of glycidyl methacrylate and hydroxypropyl methacrylate wherein the molar ratio of GMA to HPM was 0.5:0.5.

A. Anti-Reflective Coating Properties.

The coating was applied and baked as described in previous examples to give a film with an optical density of 12.1/$\mu$m at 248 nm wavelength. Ethyl lactate stripping loss was nil. The APEX-E interlayer was 39 Å (3.0%).

B. Plasma Etch Data.

The anti-reflective coating exhibited an etch selectivity of 1.52 relative to polyarylethersulfone when etched in a gas composition comprised of argon, $CF_4$, $CHF_3$, and He.

C. Lithographic Performance.

The anti-reflective coating gave excellent feature profiles with APEX-E photoresist.

EXAMPLE 9

An anti-reflective coating was prepared analogously to that in Example 7 using an ACA-attached copolymer of glycidyl methacrylate and hydroxyethyl methacrylate wherein the molar ratio of GMA to HEMA was 0.25:0.75.

A. Anti-Reflective Coating Formulation from the ACA-attached GMA/HEMA Copolymer.

A 15.0 g aliquot of ACA-attached copolymer containing a calculated 11.8 meq of polymer hydroxyl was combined with 39.25 g of PGME, 4.3 g of ethyl lactate, 635 mg of POWDERLINK 1174 (~5.91 meq), and 63.5 mg of p-TSA.$H_2O$. The resulting anti-reflective coating solution was deionized with 5 weight % PGME-washed DOWEX® HCR-S ion exchange beads for 4 hours. (DOWEX HCR-S is a strong acid cation exchange resin produced by the Dow Chemical Company.)

B. Anti-Reflective Coating Properties.

The anti-reflective coating exhibited an optical density of 8.97/$\mu$m at 248 nm wavelength when applied and cured as previously described. Ethyl lactate stripping was nil. The APEX-E interlayer was 55 Å.

EXAMPLE 10

A thermosetting anti-reflective coating was prepared from poly(glycidyl methacrylate) which had been fully reacted with p-anisic acid.

A. Addition of p-Anisic Acid to PGM.

A 250 ml three-necked flask equipped with magnetic stirring bar, thermometer, nitrogen inlet, and condenser with nitrogen outlet was charged with 40.4 g of 20 weight percent PGM in cyclohexanone containing a calculated 56.7 meq of glycidyl function, 62.0 g of cyclohexanone, 8.63 g (56.7 mmol) of p-anisic acid, and 0.65 g (2.85 mmol) benzyltriethylammonium chloride. The mixture was stirred under a nitrogen blanket at 95° C.–104° C. for 24 hours to complete the dye-attachment reaction.

B. Anti-Reflective Coating Formulation.

A 37.5 g aliquot of the above mother liquor containing a calculated 19.0 meq of polymer hydroxyl was combined with 122.1 g of PGME, 31.9 g of ethyl lactate, 1.02 g (9.52 meq) of POWDERLINK 1174, and 102 mg of p-TSA.$H_2O$. The resulting anti-reflective coating solution was deionized for 4 hours with 5 weight percent AMBERSEP® 200H ion exchange beads and then filtered through a 0.2 $\mu$m end-point filter. (AMBERSEP 200H is a high-capacity cation exchange resin produced by Rohm and Haas Corporation.)

C. Anti-Reflective Coating Properties.

The coating was processed as described in previous examples to give a film with an optical density of 4.64/$\mu$m at 248 nm wavelength. Ethyl lactate stripping was nil.

EXAMPLE 11

A thermosetting anti-reflective coating was prepared from poly(glycidyl methacrylate) which had been fully reacted with 4-phenylphenol.

A. Addition of 4-Phenylphenol to PGM.

A 250 ml three-necked flask equipped with magnetic stirring bar, thermometer, nitrogen inlet, and condenser with nitrogen outlet was charged with 17.75 g of 20 weight percent PGM in cyclohexanone containing a calculated 25 meq of glycidyl function, 29.4 g of cyclohexanone, and 4.25 g (25 mmol) of 4-phenylphenol. The mixture, under a nitrogen blanket, was heated to about 80° C. and 0.65 g (1.78 mmol) of 25% aqueous tetramethylammonium hydroxide added. The mixture was heated and stirred at 115° C. –120° C. for 4 hours, after which 0.386 g of p-TSA.$H_2O$ (2.03 mmol) was added to neutralize the basic catalyst.

B. Anti-Reflective Coating Formulation.

A 13.0 g sample of the above mother liquor containing a calculated 6.2 meq of polymer hydroxyl, 31.2 g of PGME, 4.80 g of ethyl lactate, 1.10 g CYMEL® 303LF, and 54.2 mg p-TSA.$H_2O$ were combined to form an anti-reflective coating solution.

C. Anti-Reflective Coating Properties.

The coating was spin coated at 4000 rpm for 60 seconds and then hot plate baked at 205° C. for 60 seconds to give a cured film with an optical density of 4.2/$\mu$m at 248 nm wavelength. Ethyl lactate stripping was nil, and the APEX-E interlayer was 55 Å (3.0%).

EXAMPLE 12

A self-curing anti-reflective coating was prepared from a partially ACA-attached copolymer of glycidyl methacrylate and 2-chloroethyl methacrylate.

A. Copolymerization of Glycidyl Methacrylate and 2-Chloroethyl Methacrylate.

A 250 ml three-necked flask equipped with magnetic stirring bar, thermometer, nitrogen inlet, and condenser with nitrogen outlet was charged with 24.0 g (168 mmol) of glycidyl methacrylate, 6.25 g (42 mmol) of 2-cloroethyl methacrylate, 120.0 g of cyclohexanone, and 151 mg of AIBN. The polymerization was carried out under nitrogen at 70° C.–80° C. for 24 hours.

B. Addition of ACA to the Copolymer to Leave Excess Glycidyl Function.

A 250 ml three-necked flask equipped with magnetic stirring bar, thermometer, nitrogen inlet, and condenser with nitrogen outlet was charged with 26.0 g (29.3 meq of glycidyl function) of the above polymer solution, 4.56 g (20.5 mmol) of ACA, 60.0 g of cyclohexanone, and 233.9 mg (1.03 mmol) of benzyltriethylammonium chloride. The addition was carried out by heating at 95° C.–105° C. under nitrogen for 26 hours.

C. Coating Properties.

About 45 g of the above mother liquor was diluted with 38.0 g of cyclohexanone giving a 6 weight percent solids solution. The solution was filtered (0.2 $\mu$m), spin coated at 4000 rpm for 60 seconds, dried at 100° C. for 30 seconds, and hot plate baked at 205° C. for 60 seconds to produce a coating with an optical density of 14.1/$\mu$m at 248 nm wavelength. Ethyl lactate stripping produced a 7.7% thickness loss and an 8.1% absorbance loss. The relatively large stripping values reflected the fact that an aminoplast was not added to crosslink the coating. The reaction of polymer hydroxyl with free glycidyl function was presumably responsible for insolubilization of the coating.

EXAMPLE 13

Thermosetting anti-reflective coatings were prepared from an ACA-attached copolymer of glycidyl methacrylate and hydroxypropyl methacrylate having a GMA to HPM molar ratio of 0.30:0.70. Two different aminoplast crosslinking agents were used to form sub-examples (a) and (b).

A. Copolymerization of Glycidyl Methacrylate and Hydroxypropyl Methacrylate at a 0.30:0.70 Molar Ratio with Added Thiol Chain Transfer Agent.

A 1-liter, four-necked flask equipped with magnetic stirring bar, thermometer, nitrogen inlet, and condenser with nitrogen outlet was charged with 84.2 g (584.00 mmol) of ROCRYL 410, 35.8 g (251.8 mmol) of glycidyl methacrylate, 0.48 g dodecanethiol, 483.8 g of PGME, and 1.20 g of AIBN. Polymerization was for 24 hours under a nitrogen blanket at 69.5° C.–77.5° C. About 153.5 mg (254 ppm) of 4-methoxyphenol was added to the cooled solution for inhibition. A GPC molecular weight determination gave the following values for the copolymer: Mw—57,000; Mn—16,700; and Mw/Mn—3.41.

B. Addition of ACA to the Copolymer.

A 1-liter, three-necked flask equipped with magnetic stirring bar, nitrogen inlet, thermometer, and condenser with nitrogen outlet was charged with 350.0 g of the above polymer solution containing a calculated 145.6 meq of glycidyl function, 32.4 g (145.8 mmol) of ACA, 299.2 g of PGME, and 0.83 g (3.64 mmol) of benzyltriethylammonium chloride. The reaction mixture was stirred under a nitrogen blanket for 24 hours at 104° C.–107° C.

C. (a) Anti-Reflective Coating Formulation Using POWDERLINK 1174.

A 312.5 g portion of the mother liquor containing a calculated 221.3 meq of polymer hydroxyl was combined with 106.8 g PGME, 41.4 g ethyl lactate, 11.94 g (111.1 meq) of POWDERLINK 1174, and 1.19 g of p-TSA.$_2$O to give a homogeneous solution. The solution was deionized by stirring with 5 weight percent of PGME-washed DOWEX HCR-S beads for 4 hours and then filtered through two layers of plastic cloth. The filtrate was diluted with 1117.1 g PGME and 124.1 g ethyl lactate, stirred to homogeneity, and filtered through stacked end-point filters.

(b) Anti-Reflective Coating Formulation Using CYMEL 303LF.

A 33.4 g aliquot of the mother liquor, 152.5 g of PGME, 20.1 g of ethyl lactate, 2.57 g of CYMEL 303LF, and 257 mg of p-TSA.H$_2$O were stirred at ambient giving a solution. A 207.0 g portion of this formulation was deionized by stirring with 10.4 g of PGME-washed DOWEX HCR-S beads for 4 hours and then filtered through two layers of plastic cloth and stacked endpoint filters.

D. (a) Anti-Reflective Coating Properties.

The coating solution was filtered (0.1 $\mu$m), spin coated at 3000 rpm for 60 seconds, and then hot plate baked at 205° C. for 60 seconds to produce an anti-reflective coating with a thickness of 882 Å and an optical density of 9.1/$\mu$m at 248 nm wavelength. Ethyl lactate stripping gave negligible thickness loss; the APEX-E interlayer was 38 Å.

(b) Anti-Reflective Coating Properties.

The coating solution was applied and cured as described above to produce an anti-reflective coating with a thickness of 894 Å and an optical density of 8.9/$\mu$m at 248 nm wavelength. Ethyl lactate stripping was negligible; the APEX-E interlayer was 35 Å.

EXAMPLE 14

An anti-reflective coating similar to that described in Example 13(a) was prepared using an ACA-attached copolymer of glycidyl methacrylate and hydroxypropyl methacrylate wherein the molar ratio of GMA to HPM was 0.35:0.65. The copolymer and mother liquor were prepared analogously to the procedures outlined in Example 13.

A. Anti-Reflective Coating Formulation.

A 246.0 g aliquot of the mother liquor containing a calculated 165.9 meq of polymer hydroxyl, 27.9 g of PGME, 26.3 g of ethyl lactate, 8.92 g (83.0 meq) of POWDERLINK 1174, and 0.89 g p-TSA.H$_2$O were combined and stirred to form a homogeneous solution. The concentrate was deionized by stirring with 15.5 g of PGME-washed DOWEX HCR-S beads for 4 hours and filtered by pouring through two layers of plastic cloth. The filtrate was diluted with 711.0 g PGME and 79.0 g ethyl lactate and then filtered through stacked end-point filters.

B. Anti-Reflective Coating Properties.

The coating solution was applied and cured as in the previous example to produce an anti-reflective coating with a thickness of 1120 Å and an optical density of 10.3/$\mu$m at 248 nm wavelength. Ethyl lactate stripping was nil; the APEX-E interlayer was 35 Å.

Comparative Example 1

A deep ultraviolet, thermosetting anti-reflective coating like that disclosed in co-pending U.S. Pat. No. 5,693,691 was prepared using a low molecular weight epoxy resin rather than a glycidyl methacrylate polymer or copolymer of this invention.

A. Addition of ACA to ARALDITE® ECN 1299 Epoxy Resin.

ARALDITE ECN 1299 resin (16.32 g containing 69.4 meq of glycidyl function), 20.00 g (90.0 mmol) of ACA, 211.5 g of cyclohexanone, and 1.0 g (4.4 mmol) of benzyltriethylammonium chloride were stirred at 85° C.–94° C. for 14.5 hours. (ARALDITE ECN 1299 is an o-cresol epoxy novolac manufactured by Ciba-Geigy Corporation.)

B. Anti-Reflective Coating Formulation.

A 245.8 g aliquot of the above mother liquor (68.6 mmol hydroxyl), 9.82 g (91.3 meq) of POWDERLINK 1174, 3.13 g of p-TSA.H$_2$O and 738.3 g of PGME were combined by stirring to form an anti-reflective coating. The coating solution was deionized by stirring with 5 weight percent of PGME-washed AMBERLITE 200C beads for 4 hours and then filtered through a 0.2 $\mu$m end-point filter. It was then diluted with an equivalent weight of PGME.

C. Anti-Reflective Coating Properties.

The coating gave an optical density of 10.7/$\mu$m when spin coated and baked at 205° C. for 50 seconds. Ethyl lactate thickness stripping was 0.2%, while the APEX-E interlayer was 7.3% of the starting thickness. The plasma etch and conformality properties of the anti-reflective coating are discussed in Examples 15 and 16, respectively.

Comparative Example 2

An anti-reflective coating composition similar to that described in Comparative Example 1 was prepared using an equivalence of ARALDITE ECN 1299 to ACA (1:1 glycidyl to carboxylic acid) for the preparation of the mother liquor. POWDERLINK 1174 was added at a 1:1 equivalence to polymer hydroxyl.

A. Anti-Reflective Coating Properties

When applied and processed at 205° C. for 60 seconds as described in previous examples, the anti-reflective coating exhibited an optical density of 11.5/μm at 248 nm wavelength.

The optical density for this composition can be compared to that of Example 2 (14.7/μm) to demonstrate the increased maximum optical density achievable with the new compositions. In both instances, a glycidyl-bearing resin or polymer was fully attached with ACA and then combined with 0.5 equivalents of POWDERLINK 1174 crosslinking agent per equivalent of polymer hydroxyl. The higher optical density of the acrylic system reflected the lower equivalent weight of glycidyl methacrylate (142 g/mol) versus the typical equivalent weight of epoxy resins such as ARALDITE ECN 1299 (ca. 220 g/mol).

EXAMPLE 15

In accordance with the invention, we have found that the new anti-reflective coating compositions provide superior etch rates in comparison to dye-attached thermosetting anti-reflective coatings derived from low molecular weight epoxy resins. The table below summarizes etch selectivity data for compositions of this invention (Examples 2, 5, 7, 8, 13a and 13b) and those of the prior art (Comparative Examples 1 and 2). All etch selectivity data are presented relative to a polyarylethersulfone anti-reflective coating (Brewer Science anti-reflective composition® CD-11, etch selectivity defined as 1:1). The faster etching characteristics of the new compositions are clearly evident.

RELATIVE ETCH SELECTIVITIES OF PRIOR ART AND NEW ANTI-REFLECTIVE COATING COMPOSITIONS

| Etch Gas Make-up | Prior Art Composition | New Thermosetting Acrylic Composition | Etch Selectivity* |
|---|---|---|---|
| $O_2$ | Comparative Ex. 1 | | 1.25 |
| | | Example 2 | 1.30 |
| | | Example 5 | 1.62 |
| | | Example 7 | 1.84 |
| $Ar/CF_4/CHF_3$/He (Mixture 1) | Comparative Ex. 1 | | 1.25 |
| | | Example 2 | 1.44 |
| | | Example 7 | 1.79 |
| | | Example 8 | 1.52 |
| $Ar/CF_4/CHF_3$/He (Mixture 2) | Comparative Ex. 1 | | 1.24 |
| | | Example 2 | 1.25 |
| | | Example 7 | 1.65 |
| | | Example 8 | 1.43 |
| $CF_4$/He/$O_2$ | Comparative Ex. 2 | | 1.11 |
| | | Example 13(a) | 1.62 |
| | | Example 13(b) | 1.64 |
| $Ar/CF_4/CHF_3$ | Comparative Ex. 2 | | 0.92 |
| | | Example 13(a) | 1.82 |
| | | Example 13(b) | 1.82 |
| $Ar/CF_4$ | Comparative Ex. 2 | | 0.97 |
| | | Example 13(a) | 1.33 |
| | | Example 13(b) | 1.37 |

*Etch selectivities are reported relative to a polyarylethersulfone anti-reflective coating.

EXAMPLE 16

Figure 2:
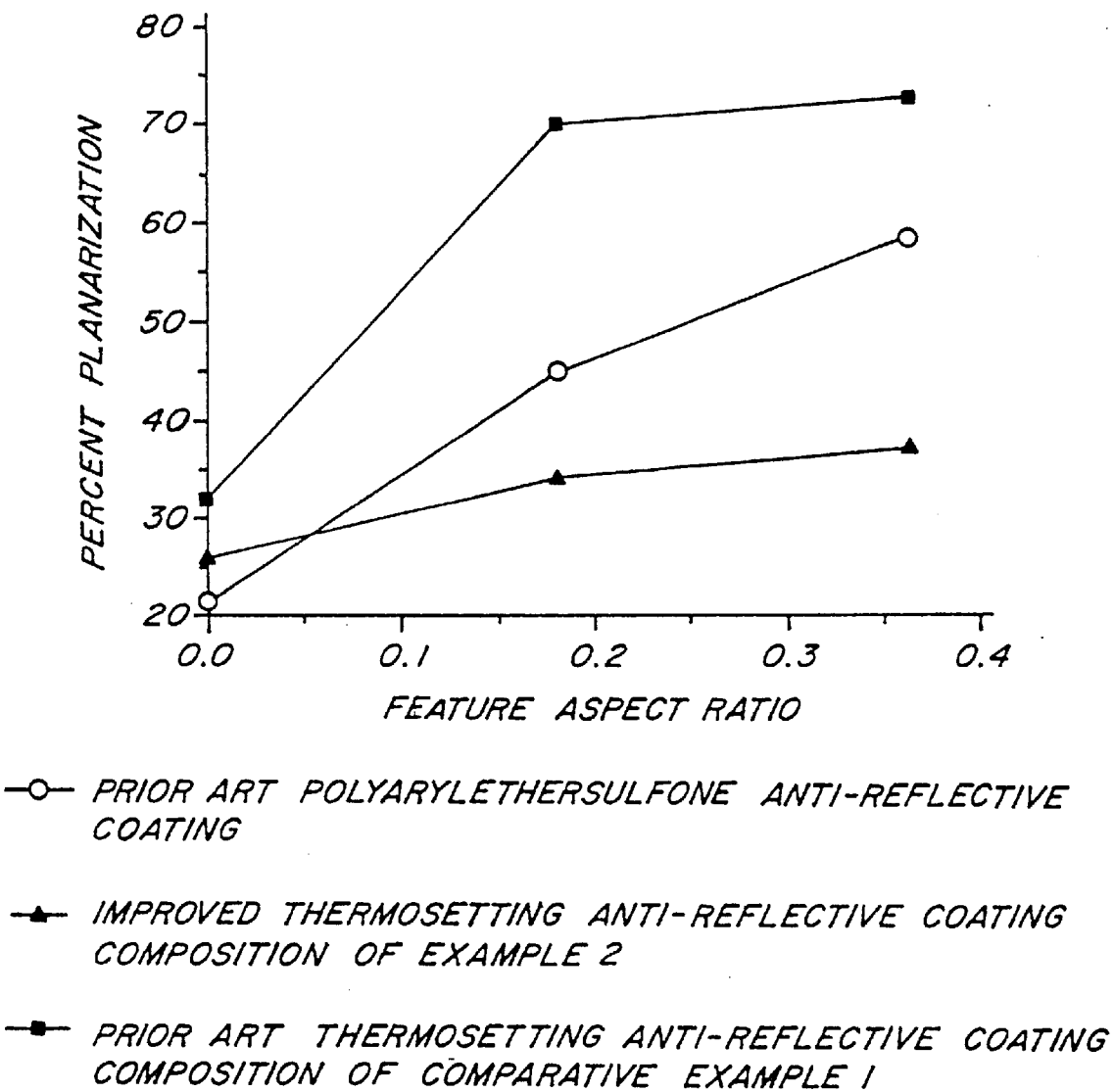
FIG. 2 is a graph showing how the planarization properties of prior art and new anti-reflective coating compositions vary with increasing aspect ratio of the substrate features.

The conformality qualities of a prior art thermosetting anti-reflective coating (Comparative Example 1) and prior art thermoplastic anti-reflective coating (polyarylethersulfone) were compared to that of the improved composition described in Example 2. FIG. 2 depicts the percent planarization of the various compositions as a function of increasing substrate feature aspect ratio. (Planarization and conformality have an inverse relationship. As planarization increases, conformality decreases.) The data clearly indicated that the thermosetting acrylic anti-reflective coating of this invention was far more conformal than the prior art compositions and that good conformality was retained even at high feature aspect ratios.

What is claimed is:

1. An improved thermosetting deep ultraviolet anti-reflective composition comprising:
    a. the reaction product of a high molecular weight acrylic polymer or copolymer and a deep ultraviolet light-absorbing carboxylic acid or phenolic dye, said reaction product having the polymer or copolymer linked to the carboxylic acid or phenolic dye via a hydroxyester moiety in the case of carboxylic acid dyes or a hydroxyether moiety in the case phenolic dyes, which moiety forms in situ during the reaction;
    b. an alkylated aminoplast crosslinking agent selected from the group consisting of melamine, urea, benzyoguanamine, glycoluril and derivatives thereof;
    c. a protonic acid catalyst for curing; and
    d. a low-to-medium boiling point, i.e., 70° C. to 180° C., alcohol-containing solvent system comprising at least 20% alcohol,
    whereby said composition has improved plasma etch rate while retaining fast curing speed, high optical density, good solubility in and coatability from safe, volatile solvents having high differential solubility as between photoresist, and having improved conformality and feature coverage.

2. The composition of claim 1 wherein the hydroxyester or hydroxyether moiety is derived by reaction of the dye with a glycidyl methacrylate unit contained in the acrylic polymer or copolymer.

3. The composition of claim 2 wherein the glycidyl methacrylate containing acrylic polymer or copolymer has a number average molecular weight (Mn) range of from 5,000 to 30,000 g/mol and a weight average molecular weight (Mw) range of from 20,000 to 100,000 g/mol.

4. The composition of claim 2 wherein the glycidyl methacrylate containing acrylic polymer or copolymer has an Mn of from 10,000 to 20,000 g/mol, and an Mw of from 30,000 to 70,000 g/mol.

5. The composition of claim 2 wherein the acrylic polymer is a homopolymer of glycidyl methacrylate or a copolymer of glycidyl methacrylate with comonomers selected from the group consisting of 2-hydroxyethyl methacrylate, hydroxypropyl methacrylate, methyl methacrylate, and 2-chloroethyl methacrylate.

6. The composition of claim 5 comprising glycidyl methacrylate copolymers having at least 20 mole percent glycidyl methacrylate comonomer to enhance the optical density.

7. The composition of claim 6 having 30 mole percent glycidyl methracylate.

8. The composition of claim 7 having a phenolic dye selected from the group consisting of 4-hydroxybiphenyl, 2-hydroxyquinaldine, 5,7-dichloro-8-hydroxyquinoline, and 2-acetoxynaphthol.

9. The composition of claim 8 wherein the protonic acid is selected from the group consisting of p-toluenesulfonic acid, dodecylbenzenesulfonic acid, oxalic acid, phthalic acid, and naphthalenesulfonic acid.

10. The composition of claim 2 wherein the acrylic polymer is a homopolymer of glycidyl methacrylate or a copolymer of glycidyl methacrylate with comonomers selected from the group consisting of 2-hydroxyethyl methacrylate and hydroxypropyl methacrylate.

11. The composition of claim 2 wherein the aminoplast curing agents are present in concert with polyphenols selected from the group consisting of novolacs and poly(4-hydroxystyrene), which polyphenols serve to effect thermal crosslinking by reacting with free glycidyl sites on the dye-attached acrylic polymer or copolymer, while not serving as a primary dye component.

12. The composition of claim 1 having a hydroxyl equivalent weight for the polymer or copolymer of less than 400 gm/equivalent for improved crosslink density.

13. The composition of claim 1 wherein the deep ultraviolet light-absorbing dyes have sufficient intrinsic absorptivity and are present in concentration to effect an optical density of at least 7.0 per micron film thickness at an exposing wavelength of 248 nm.

14. The composition of claim 13 having an optical density of >9.0 per micron film thickness at 248 nm for use in performing sub-0.30 micron photolithography.

15. The composition of claim 13 having carboxylic acid dyes selected from the group consisting of 9-anthracenecarboxylic acid, 2-naphthoic acid, 9-acridinecarboxylic acid, and p-anisic acid.

16. The composition of claim 13 wherein the carboxylic acid dye is 9-anthracenecarboxylic acid.

17. The composition of claim 1 having a strong protonic acid having a formula greater than 80 g/mole to prevent sublimation during thermal cure.

18. The composition of claim 1 wherein the weight ratio of reactive equivalents of aminoplast to that of the acrylic polymer or copolymer hydroxy moiety is from 0.20 to 2.00, and the weight percent of acid catalyst based upon the weight of aminoplast ranges from 5 to about 20 weight percent, and the weight percent of total solids in the coating ranges from 2.5 to about 10.0%.

19. The composition of claim 1 wherein its etch selectivity to novolac and poly(hydroxystyrene) based photoresists is greater than 1.0 under plasma etch conditions in which oxygenated, fluorinated or chlorinated gases or mixtures thereof are used to generate the active etching species.

* * * * *